United States Patent [19]

Hinz et al.

[11] Patent Number: 4,480,196

[45] Date of Patent: Oct. 30, 1984

[54] INPUT PROTECTION CIRCUITS FOR INTEGRATED CIRCUIT DEVICES

[75] Inventors: Lorne C. Hinz; David R. Whiting, both of Nepean,, Canada

[73] Assignee: Northern Telecom Limited, Montreal, Canada

[21] Appl. No.: 380,608

[22] Filed: May 21, 1982

[51] Int. Cl.³ .......................................... H03K 17/60
[52] U.S. Cl. ................................................ 307/200 A
[58] Field of Search ....... 364/200 MS FILE, 900 MS FILE; 361/56, 86, 90, 91, 100; 357/40, 41, 42, 51; 307/200 A, 296 R

[56] References Cited

U.S. PATENT DOCUMENTS

| | | | |
|---|---|---|---|
| 3,906,298 | 9/1975 | Sylvan | 361/100 |
| 4,048,584 | 9/1977 | Ulmer | 361/91 X |
| 4,086,642 | 4/1978 | Yoshida et al. | 361/91 |
| 4,131,928 | 12/1978 | Davis et al. | 361/91 X |
| 4,157,513 | 6/1979 | Ghiringhelli et al. | 357/81 X |
| 4,208,594 | 6/1980 | Guicheteau | 307/200 A |
| 4,281,260 | 7/1981 | Moegen et al. | 307/296 R X |
| 4,414,599 | 11/1983 | Kobayashi | 361/56 |
| 4,423,431 | 12/1983 | Sasaki | 357/41 |

Primary Examiner—Raulfe B. Zache
Attorney, Agent, or Firm—R. John Haley

[57] ABSTRACT

An imput of a CMOS integrated circuit device is protected from excessive voltage swings at an input terminal by a protection circuit which comprises two series-connected protective stages between the device input terminal and the input. Each protective stage comprises a current-limiting series resistor and clamping diodes connected to the supply voltages of the device. The two stages enable the series resistance of the protection circuit to be much lower than that required for a single stage diode clamping arrangement, this being particularly advantageous if the device is an analog-to-digital converter for converting to digital values analog voltages present at the input terminal.

11 Claims, 1 Drawing Figure

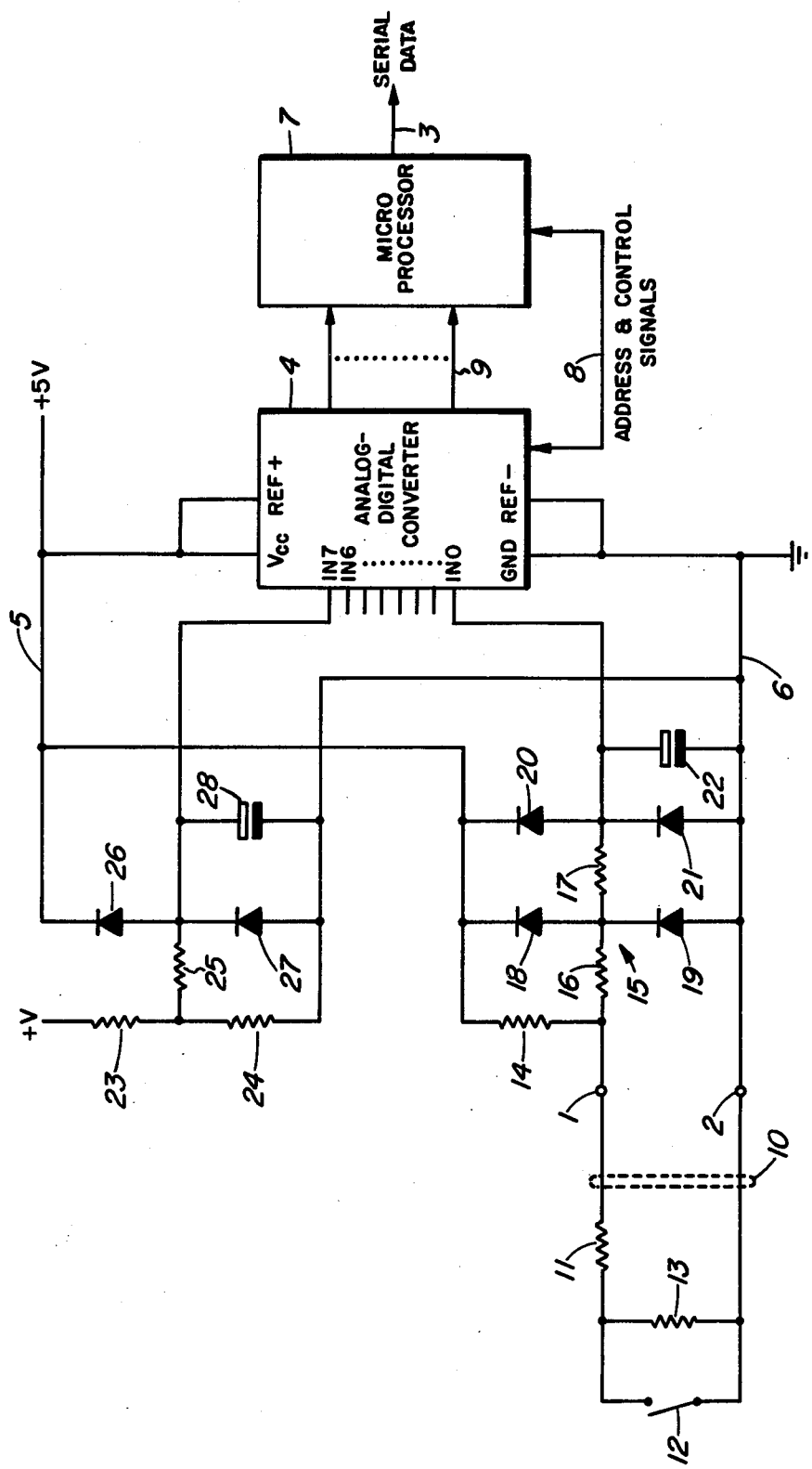

INPUT PROTECTION CIRCUITS FOR INTEGRATED CIRCUIT DEVICES

This invention relates to input protection circuits for integrated circuit devices.

Integrated circuit devices such as CMOS (complementary metal-oxide-semiconductor) devices generally have a maximum input voltage range of −0.3 volts to $V_{cc}+0.3$ volts relative to ground (0 volts), where $V_{cc}$ is the supply voltage for the device and is typically 5 volts. Complying with this maximum range presents a problem where an input of a CMOS device may be subject to an externally-applied voltage which may greatly exceed this range.

This problem can be overcome by connecting appropriately-poled diodes between the CMOS device input and the respective supply voltage lines so that the input voltage can not swing by more than the forward voltage drop of the diodes beyond the supply voltages. In this case in order to limit the forward voltage drop of each diode to the maximum permissible value of 0.3 volts, the forward current of the diodes must be limited by a high-value resistance connected in series with the CMOS device input. If the CMOS device is intended to monitor precisely a voltage which is normally within the maximum input voltage range, such a high-value series resistance has the disadvantage of adversely affecting such precise monitoring.

An object of this invention, therefore, is to provide an improved input protection circuit which enables the above disadvantage to be avoided.

According to one aspect this invention provides a circuit arrangement comprising an integrated circuit device, two supply voltage lines connected to said device for supplying respective predetermined supply voltage thereto, and a protection circuit connected between an input terminal and an input of said device, the protection circuit comprising a first resistor connected between the input terminal and a junction point, a first clamping diode connected between the junction point and one of said supply voltage lines, a second resistor coupled between the junction point and the device input, and a second clamping diode connected between the device input and said one of said supply voltage lines, each of said diodes being poled to be reverse-biased in response to voltages between said supply voltages being applied to said input terminal.

Thus the first resistor and first clamping diode serve to limit voltage swings beyond the relevant supply voltage to a certain extent, and such voltage swings are further reduced by the second resistor and second clamping diode so that at the device input they are within the permissible range for the device. The use of first and second current limiting resistors and clamping diodes in this manner enables the total resistance of the two resistors to be very much smaller than would be necessary for the same protection afforded by a single resistor and clamping diode.

The integrated circuit device may be a CMOS integrated circuit device such as an analog-to-digital converter an analog signal input of which constitutes said input.

The first diode may have a forward voltage-current characteristic with a greater voltage drop than that of the second diode; for example the first diode may be a silicon diode and the second diode may be a germanium or Schottky barrier diode.

The circuit arrangement preferably includes a third diode, having characteristics similar to those of the first diode, connected between the junction point and said other of the supply voltage lines, and a fourth diode, having characteriistics similar to those of the second diode, connected between the device input and said other of the supply voltage lines, each of the third and fourth diodes being poled to be reverse-biased in response to voltages between the supply voltages being applied to said input terminal.

According to another aspect this invention provides a circuit arrangement comprising a CMOS integrated circuit analog-to-digital converter having an analog signal input, two supply voltage line connected to said converter for supplying respective predetermined supply voltages, thereto and a protection circuit connected between an input terminal and said analog signal input, the protection circuit comprising a first resistor connected between the input terminal and a junction point, a first pair of diodes, each diode of the first pair being connected between the junction point and a respective one of the supply voltage lines, a second resistor connected between the junction point and said analog signal input, and a second pair of diodes, each diode of the second pair being connected analog signal between said input and a respective one of the supply voltage lines, the diodes being poled to be reverse-biased when a voltage between said supply voltages is applied to the input terminal.

The circuit arrangement conveniently includes a resistor connected between the input terminal and one of the supply voltage lines and a circuit to be monitored connected between the input terminal and the other of the supply voltage lines, whereby a digital output of the converter represents the state of the circuit to be monitored. The circuit to be monitored for example comprises contacts of a switch which may be open or closed, or a transistor which may be conductive or non-conductive, and may include resistive components to enable distinction of the states of the circuit being monitored from an open-circuit or short-circuit of a line connecting the circuit being monitored to the remainder of the circuit arrangement.

The invention will be further understood from the following description with reference to the accompanying drawing, which schematically illustrates a circuit arrangement including an input protection circuit in accordance with an embodiment of the invention.

Referring to the drawing, the circuit illustrated therein serves to monitor the voltage at an input terminal 1 with respect to ground or 0 volts at a terminal 2, and to convert the monitored voltage into a digital value for serial transmission over a wire 3, which may be constituted by a telephone line or a dedicated data link. Although only one is shown, a plurality of such input terminals 1 may be provided, each coupled to a respective one of inputs IN0 to IN6 of an analog-to-digital converter 4 via a respective input protection circuit as described below, for monitoring a respective voltage level for any of a variety of purposes such as remote metering, sensing temperatures, smoke, water, etc., and security monitoring. A voltage +V is also monitored as described below by being coupled to an input IN7 of the converter 4.

The converter 4, which is for example a National Semiconductor ADC0809 integrated circuit, is a CMOS device which has its power supply inputs Vcc and GND connected respectively to a +5 volt supply line 5 and a ground line 6, to which the terminal 2 is connected. Reference voltage inputs REF+ and REF− of the converter 4 are also connected respectively to the lines 5 and 6. For selecting one of its inputs IN0 and IN7 and initiating an analog-to-digital conversion process the converter 4 is supplied by a microprocessor 7 via lines 8 with an address and control signals, and returns a signal to the microprocessor 7 via one of these lines at the end of its conversion process, in response to which the microprocessor 7 produces the serial data on the line 3 from the parallel digital data available from outputs of the converter 4 via lines 9.

It is assumed for example that the terminals 1 and 2 are connected as shown via a 2-wire line 10 of arbitrary length and a series resistor 11 to a security switch 12 the open or closed state of which is being monitored. A resistor 13 is connected in parallel with the switch 12, and a resistor 14 is coupled between the line 5 and the input terminal 1. For example the resistors 11, 13, and 14 have resistances of 1.8 kΩ, 3.3 kΩ, and 3 kΩ respectively so that the four possible states line 10 open-circuit, switch 12 open, switch 12 closed, and line 10 short-circuit produce distinct voltages of 5, 3.1, 1.9, and 0 volts respectively at the input terminal 1. When the input terminal 1 is selected by the address on the lines 8, the relevant voltage at this terminal can be converted to an 8-bit digital value by the converter 4, the two most significant bits of which can be selected and applied serially to the line 3 by the microprocessor 7 to identify each of the four possible states.

Although in normal operation the voltage at the input terminal 1 does not exceed the supply voltage range of the converter 4, an external voltage outside this range could be applied between the terminals 1 and 2. In order to prevent damage to the converter 4 in this event, the terminal 1 is coupled to the input IN0 not directly, but via an input protection circuit 15. In accordance with the invention, the circuit 15 comprises two protective stages, each comprising a series resistor 16 and 17 and a pair of clamping diodes 18, 19 and 20, 21. In addition, the circuit 15 includes a smoothing capacitor 22 connected between the input IN0 and the ground line 6.

The diodes 18 and 19 are silicon diodes which have a forward voltage drop of about 0.7 volts when they conduct a current of about 1 mA. In order to limit the current conducted by either diode 18 or 19 to about 1 mA for external voltages up to about ±40 volts applied to the input terminal 1 with respect to the terminal 2, the resistor 16 has a resistance of 39 kΩ. As a result of the clamping action of the diodes 18 and 19, the voltage range at the junction between the resistors 16 and 17 is limited to −0.7 volts to +5.7 volts.

The diodes 20 and 21 are germanium or, preferably, Schottky barrier diodes (e.g. Hewlett Packard type 5082-2800) which have a forward voltage drop of less than 0.3 volts when they conduct a current of about 0.04 mA. For voltage extremes of −0.7 or +5.7 volts at the junction between the resistors 16 and 17 as described above, the current through the diodes 20 and 21 is limited to this value if the resistor 17 has a resistance of 10 kΩ. Thus the voltage extremes at the input IN0 of the converter 4 are limited to −0.3 volts and +5.3 volts, which are the input voltage extremes tolerated by the converter 4.

Thus the converter 4 is protected by the circuit 15 from relatively large voltage levels applied to the input terminal 1. The total series resistance of the resistors 16 and 17 is less than 50 kΩ, which is negligible compared with the input impedance of the converter 4 at the input IN0 and so does not impair the conversion accuracy of the converter 4. In contrast, if the diodes 18 and 19 and the series resistor 16 were omitted from the protection circuit, then for the same forward current for the diodes 20 and 21, and the same voltage extremes at the input terminal 1, the resistance of the resistor 17 would have to be increased to about 1 MΩ to protect the converter 4. Such a high series resistance is comparable with the input impedance of the converter 4 and consequently would seriously impair the conversion accuracy of the converter. The two protective stages of the circuit 15 avoid this disadvantage.

It should be noted that, if it were desired to protect the converter 4 from only positive or only negative voltages applied to the input terminal 1, then the diodes 19 and 21 or 18 and 20, respectively, can be omitted from the circuit 15.

The capacitor 22 has a capacitance of, for example, 2.2 μF, and serves with the resistors 16 and 17 to smooth voltage fluctuations at the input IN0. Thus noise voltage spikes which may occur at the input terminal 1 are prevented from being applied to the converter 4, where they could disturb a conversion operation especially if the converter 4 has no input sample-and-hold circuitry. Furthermore, the smoothing circuit formed by the capacitor 22 and the resistors 16 and 17 has a time constant of about 110 ms, so that it also serves to eliminate voltages induced from a.c. supplies.

Other input terminals can be coupled to the other inputs of the converter 4 via similar protection circuits. For the input IN7, the drawing illustrates an arrangement for monitoring the voltage +V, which may be a supply voltage from which the +5 Volts supply on the line 5 is derived. For example, the voltage +V may be a supply voltage which is derived from an external a.c. supply backed up by a battery, the voltage being lower in the event of failure of the a.c. supply than during normal operation. Thus monitoring of this voltage can indicate the presence or absence of the a.c. supply and the state of charge of the back-up battery.

In the drawing, the voltage +V of, for example, nominally 9.5 volts is divided by a potential divider comprising resistors 23 and 24 of resistance 6.8 kΩ and 4.7 kΩ respectively to produce a voltage which is within the permissible input voltage range of the converter 4. This voltage is coupled to the input IN7 via a single protective stage comprising a series 51 kΩ resistor 25, clamping Schottky barrier diodes 26 and 27 and a 2.2 μF smoothing capacitor 28, whose functions will be apparent from the foregoing description. Only a single protective stage is used here because the voltage being monitored is an internal voltage of predictable magnitude; however two protection stages as in the circuit 15 could be provided in this case if desired.

Thus the input IN7 of the converter 4 is used for monitoring the voltage supply of the circuit arrangement. In this case, in view of the non-linear voltage-discharge characteristic of a battery, the digital value of all of the outputs of the converter 4 may be used by the microprocessor 7 to derive a, for example, 2-bit serial data signal on the line 3 to represent the state of charge of the battery underload, as represented by the monitored voltage +V.

Although in the circuit 15 as described above the diodes 18 and 19 are of a different type (silicon) to the diodes 20 and 21 (germanium or Schottky barrier), this need not necessarily be the case. For example, all of the diodes 18 to 21 could be germanium or Schottky barrier diodes having the same forward voltage-current characteristics. Furthermore, although the circuit 15 includes only two protective stages, a greater number of series-connected protective stages could be provided if desired. In addition, a smoothing capacitor such as the capacitor 22 can be provided individually for each protective stage if desired.

In addition, although the embodiment of the invention described above relates to input connections to a CMOS analog-to-digital converter, the invention is equally applicable to input protection of other CMOS devices and other integrated circuit devices generally.

Thus whilst a particular embodiment of the invention has been described in detail, numerous modifications, variations, and adaptations may be made thereto without departing from the scope of the invention as defined in the claims.

What is claimed is:

1. A circuit arrangement comprising an integrated circuit device two supply voltage lines connected to said device for supplying respective predetermined supply voltages thereto, and a protection circuit connected between an input terminal and an input of said device, the protection circuit comprising a first resistor connected between the input terminal and a junction point, a first clamping diode connected between the junction point and one of said supply voltage lines, a second resistor coupled between the junction point and the device input, and a second clamping diode connected between the device input and said one of said supply voltage lines, each of said diodes being poled to be reverse-biased in response to voltages between said supply voltages being applied to said input terminal.

2. A circuit arrangement as claimed in claim 1 wherein said integrated circuit device comprises a CMOS integrated circuit device.

3. A circuit arrangement as claimed in claim 2 wherein said integrated circuit device comprises an analog-to-digital converter and the device input is an analog signal input thereof.

4. A circuit arrangement as claimed in claim 1, 2, or 3 and including a smoothing capacitor having a first terminal connected to said junction point or to said device input and having a second terminal connected to one of said supply voltage lines.

5. A circuit arrangement as claimed in claim 1 wherein the first diode has a forward voltage-current characteristic with a greater voltage drop than that of the second diode.

6. A circuit arrangement as claimed in claim 1, 2, or 5 and including a third diode, having characteristics similar to those of the first diode, connected between the junction point and said other of the supply voltage lines, and a fourth diode, having characteristics similar to those of the second diode, connected between the device input and said other of the supply voltage lines, each of the third and fourth diodes being poled to be reverse-biased in response to voltages between the supply voltages being applied to said input terminal.

7. A circuit arrangement as claimed in claim 1, 2, or 5 wherein said second diode is a Schottky barrier diode.

8. A circuit arrangement comprising a CMOS integrated circuit analog-to-digital converter having an analog signal input, two supply voltage lines connected to said converter for supplying respective predetermined supply voltages thereto, and a protection circuit connected between an input terminal and said analog signal input, the protection circuit comprising a first resistor connected between the input terminal and a junction point, a first pair of diodes, each diode of the first pair being connected between the junction point and a respective one of the supply voltage lines, a second resistor connected between the junction point and said analog signal input, and a second pair of diodes, each diode of the second pair being connected between said analog signal input and a respective one of the supply voltage lines, the diodes being poled to be reverse-biased when a voltage between said supply voltages is applied to the input terminal.

9. A circuit arrangement as claimed in claim 8 wherein each of the diodes of the second pair of diodes is a Schottky barrier diode.

10. A circuit arrangement as claimed in claim 9 and including a smoothing capacitor connected between said analog signal input and one of the supply voltage lines.

11. A circuit arrangement as claimed in claim 8, 9, or 10 and including a resistor connected between the input terminal and one of the supply voltage lines and a circuit to be monitored connected between the input terminal and the other of the supply voltage lines, whereby a digital output of the converter represents the state of the circuit to be monitored.

* * * * *